US011923169B2

United States Patent
Jen et al.

(10) Patent No.: US 11,923,169 B2
(45) Date of Patent: Mar. 5, 2024

(54) APPARATUS AND METHOD FOR METAL CONTAMINATION CONTROL IN AN ION IMPLANTATION SYSTEM USING CHARGE STRIPPING MECHANISM

(71) Applicant: Axcelis Technologies, Inc., Beverly, MA (US)

(72) Inventors: Causon Ko-Chuan Jen, San Jose, CA (US); Shu Satoh, Byfield, MA (US); Genise Bonacorsi, Newburyport, MA (US); William Bintz, Londonderry, NH (US)

(73) Assignee: Axcelis Technologies, Inc., Beverly, MA (US)

( * ) Notice: Subject to any disclaimer, the term of this patent is extended or adjusted under 35 U.S.C. 154(b) by 253 days.

(21) Appl. No.: 17/168,897

(22) Filed: Feb. 5, 2021

(65) Prior Publication Data

US 2021/0249222 A1  Aug. 12, 2021

Related U.S. Application Data

(60) Provisional application No. 62/971,473, filed on Feb. 7, 2020.

(51) Int. Cl.
*H01J 37/317* (2006.01)
*H01J 37/08* (2006.01)

(52) U.S. Cl.
CPC .......... *H01J 37/3171* (2013.01); *H01J 37/08* (2013.01); *H01J 2237/0048* (2013.01);
(Continued)

(58) Field of Classification Search
CPC ................ H01J 37/3171; H01J 37/08; H01J 2237/0048; H01J 2237/022; H01J 2237/055; H01J 2237/31705; H01J 37/05
See application file for complete search history.

(56) References Cited

U.S. PATENT DOCUMENTS 6,639,227 B1  10/2003 Glavish et al.
8,035,080 B2  10/2011 Satoh
(Continued)

FOREIGN PATENT DOCUMENTS

JP    H0823067 B2 *  3/1993
JP    2003303569 A *  10/2003

OTHER PUBLICATIONS

Kirkwood et al., "Contamination control in Axcelis Purion platform ion implanters", 20th international conference on Ion Implantation Technology 2014 (Year: 2014).*
(Continued)

*Primary Examiner* — Michael J Logie
(74) *Attorney, Agent, or Firm* — Eschweiler & Potashnik, LLC (57) ABSTRACT

A method for implanting high charge state ions into a workpiece while mitigating trace metal contamination includes generating desired ions at a first charge state from a desired species in an ion source, as well as generating trace metal ions of a contaminant species in a first ion beam. A charge-to-mass ratio of the desired ions and the trace metal ions is equal. The desired ions and trace metal ions are extracted from the ion source. At least one electron stripped from the desired ions to define a second ion beam of the desired ions at a second charge state and the trace metal ions. Only the desired ions from the second ion beam are selectively passed only through a charge selector to define a final ion beam of the desired ions at the second charge state and no trace metal ions, and the desired ions of the second charge state are implanted into a workpiece.

18 Claims, 9 Drawing Sheets

(52) U.S. Cl.
CPC ............... *H01J 2237/022* (2013.01); *H01J 2237/055* (2013.01); *H01J 2237/31705* (2013.01)

(56) References Cited

U.S. PATENT DOCUMENTS

| | | | |
|---|---|---|---|
| 2002/0171049 A1 | 11/2002 | Kwon | |
| 2009/0183679 A1* | 7/2009 | McIntyre | H01J 37/08 118/723 CB |
| 2011/0101213 A1* | 5/2011 | Satoh | H01J 37/08 250/282 |
| 2017/0250084 A1* | 8/2017 | Byl | H01J 37/244 |
| 2019/0385830 A1* | 12/2019 | Mous | H01J 49/0086 |
| 2020/0381209 A1 | 12/2020 | Satoh | |
| 2021/0249222 A1* | 8/2021 | Jen | H01J 37/05 |
| 2022/0068588 A1* | 3/2022 | Ansai | H01J 37/3171 |

OTHER PUBLICATIONS

JPH0823067 machine translation (Year: 2023).*
JP2003303569 machine translation (Year: 2023).*
CIAAW Commission on Isotopic abundances and atomic weights, International union of pure and applied chemistry (Year: 2015).*
Satoh, "Acceleration of 4+ Ions in an RF Linac Accelerator", 22nd International Conference on Ion Implantation Technology (Year: 2018).*
Current et al., "Channeled MeV B, P and As profiles in Si(100): Monte-Carol Models and SIMS" 22nd International Conference on Ion Implantation Technology (Year: 2018).*
Satoh et al., "Purion XEmax, Axcelis ultra-high energy implanter with Boost technology", MRS Advances (Year: 2023).*
International Search Report and Written Opinion dated May 21, 2021 in connection with PCT/US2021/016996.
Hotchkis M A C et al: "Sulphur hexafluoride as a stripper gas for tandem accelerators"; Nuclear Instruments & Methods in Physics Research. Section B: Beam Interactions With Materials and Atoms, Elsevier BV, NL, vol. 302, Mar. 26, 2013 (Mar. 26, 2013), pp. 14-18, XP028535585, ISSN: 0168-583X.
Axcelis Investor Day 2019 The Next Wave of Purion Innovation. Published Sep. 24, 2019.
Chung-Yu Wu et al. "Design, Optimization, and Performance Analysis of New Photodiode Structures for CMOS Active-Pixel-Sensor (APS) Imager Applications." Published Feb. 2004.
William C. McColgin et al. "Effects of Deliberate Metal Contamination on CCD Imagers." Published 1992.
Shu Satoh. "Acceleration of 4+ Ions in an RF Linac Accelerator." Published in 2018.
L. Marton et al. "Methods of Experimental Physics, vol. 17." Published in 1980.
Shu Satoh et al. "Optima XE Single Wafer High Energy Ion Implanter." Published in 2008.
Wilhelm Platow et al. "Neutron radiation due to high energy boron ion beams." Published online Nov. 15, 2022.
Townsend, P.D. (Peter David) et al. "Ion implantation, sputtering and their applications." Published in 1976.
Robert Rathmell et al. "Implant Angle Repeatability on Optima MD." Published in 2008.
Serguel Kondratenko et al. "Analysis of dopant distribution profiles of very high energy implants." Published online Nov. 21, 2022.

* cited by examiner

APPARATUS AND METHOD FOR METAL CONTAMINATION CONTROL IN AN ION IMPLANTATION SYSTEM USING CHARGE STRIPPING MECHANISM

REFERENCE TO RELATED APPLICATIONS

This application claims the benefit of U.S. Provisional Application Ser. No. 62/971,473 filed Feb. 7, 2020, the contents of all of which are herein incorporated by reference in their entirety.

FIELD

The present disclosure relates generally to ion implantation systems, and more particularly to a system and method for controlling contamination and increases ion beam current at a high energy for a desired charge state.

BACKGROUND

In the manufacture of semiconductor devices, ion implantation is used to dope semiconductors with impurities. Ion implantation systems are often utilized to dope a workpiece, such as a semiconductor wafer, with ions from an ion beam, in order to either produce n- or p-type material doping, or to form passivation layers during fabrication of an integrated circuit. Such beam treatment is often used to selectively implant the wafers with impurities of a specified dopant material, at a predetermined energy level, and in controlled concentration, to produce a semiconductor material during fabrication of an integrated circuit. When used for doping semiconductor wafers, the ion implantation system injects a selected ion species into the workpiece to produce the desired extrinsic material. Implanting ions generated from source materials such as antimony, arsenic, or phosphorus, for example, results in an "n-type" extrinsic material wafer, whereas a "p-type" extrinsic material wafer often results from ions generated with source materials such as boron, gallium, or indium.

A typical ion implanter includes an ion source, an ion extraction device, a mass analysis device, with or without a post acceleration section, a beam transport device, and a wafer processing device. The ion source generates ions of desired atomic or molecular dopant species. These ions are extracted from the ion source by the ion extraction device, which are typically a set of electrodes that energize and direct the flow of ions from the ion source, forming an ion beam. Desired ions are separated from the ion beam in the mass analysis device, which is typically a magnetic dipole performing mass dispersion or separation of the extracted ion beam. The beam transport device, which is typically a vacuum system containing a series of focusing devices, transports the analyzed ion beam to the wafer processing device while maintaining desired properties of the ion beam. Finally, semiconductor wafers are transferred in to and out of the wafer processing device via a wafer handling system, which may include one or more robotic arms, for placing a wafer to be treated in front of the analyzed ion beam and removing treated wafers from the ion implanter.

RF-based accelerators and DC-based accelerators can be implemented in the ion implanter, whereby ions can be repeatedly accelerated through multiple acceleration stages of an accelerator. For example, RF-based accelerators can have voltage driven acceleration gaps. Due to the time varying nature of RF acceleration fields and the multiple numbers of acceleration gaps, there are a large number of parameters that influence the final beam energy. Because the charge state distribution of an ion beam can change, substantial effort is paid to keep the charge value in the ion beam at an initially intended single value.

SUMMARY

The present disclosure appreciates that significant demands for an implantation recipe (e.g., ion beam energy, mass, charge value, beam purity, beam current and/or total dose level of the implantation) at a high energy level call for providing a higher beam current and beam purity without unnecessarily compromising the ion source. Accordingly, systems or methods for increasing beam current with high purity are provided herewith.

Accordingly, the following presents a simplified summary of the disclosure in order to provide a basic understanding of some aspects of the disclosure. This summary is not an extensive overview of the disclosure. It is intended to neither identify key or critical elements of the invention nor delineate the scope of the invention. Its purpose is to present some concepts of the disclosure in a simplified form as a prelude to the more detailed description that is presented later.

Aspects of the disclosure facilitate ion implantation processes for implanting ions (e.g., arsenic ions) into a workpiece. According to one exemplary aspect, an ion implantation system is provided having an ion source configured to form an ion beam, a beamline assembly configured to selectively transport the ion beam, and an end station is configured to accept the ion beam for implantation of ions into a workpiece.

In accordance with one exemplary aspect, the ion source is configured to generate both desired ions of a desired species and trace metal ions of a contaminant species. The desired ions of the desired species, for example, are at a first charge state, wherein a charge-to-mass ratio of the desired ions and the trace metal ions is equal. An extraction apparatus is configured to extract the desired ions and trace metal ions from the ion source to define a first ion beam, and a mass analyzer is configured to select the desired ions and trace metal ions from the first ion beam, thereby defining a mass analyzed ion beam. An accelerator is configured to accelerate the mass analyzed ion beam from a first energy to a second energy, and a charge stripping apparatus is configured to strip at least one electron from the desired ions, thereby defining a second ion beam comprising the desired ions at a second charge state and the trace metal ions. Further, a charge selector is positioned downstream of the charge stripping apparatus, wherein the charge selector is configured to selectively pass only the desired ions at the second charge state therethrough. Accordingly, a final ion beam is defined, wherein the final ion beam comprises the desired ions at the second charge state and no trace metal ions. An end station can be further configured to accept the final ion beam for implantation of the desired ions into a workpiece.

According to one example, the charge selector comprises an electromagnetic mass analyzer positioned proximate to the charge stripping apparatus. In another example, the charge stripping apparatus is positioned within the accelerator.

The accelerator, for example, can comprise a plurality of accelerator stages, wherein the charge stripping apparatus is positioned between at least two of the plurality of accelerator stages. The accelerator, for example, can comprise an RF accelerator having one or more resonators configured to generating an accelerating RF field. For example, in an RF accelerator, the plurality of accelerator stages respectively comprise one or more resonators configured to generating an accelerating field.

In another example, the accelerator comprises DC accelerator configured to accelerate the desired ions via a stationary DC high voltage. In yet another example, the charge selector comprises an energy filter. Further, a scanner can be provided and configured to reciprocally scan the final ion beam to define a scanned ion beam. The scanner, for example, can comprise an electrostatic scanner or an electromagnetic scanner configured to respectively electrostatically or electromagnetically scan the final ion beam to define the scanned ion beam. In another example, an angle corrector lens is provided and configured to parallelize and shift the scanned ion beam for implantation into the workpiece.

According to yet another example, the charge stripping apparatus comprises a pump and a gas source, wherein the pump is configured to pump a gas from the gas source and to control a flow of the gas into the accelerator, and wherein the flow of the gas is configured to strip electrons from the ions of the desired species. The gas, for example, comprises sulfur hexafluoride.

The desired ions, for example, can comprise arsenic ions, and the trace metal ions can comprise titanium or iron. For example, the desired ions of the first charge state can comprise $_{75}$As 3+ ions, and the trace metal ions comprise $_{50}$Ti 2+ ions. In another example, the desired ions of the first charge state can comprise $_{75}$As 4+ ions, and the trace metal ions comprise $_{56}$Fe 3+ ions.

In accordance with another example aspect, an ion implantation system is provided comprising an ion source configured to generate an ion beam along a beamline, wherein the ion beam comprises first charge state ions and trace metal ions. A mass analyzer is provided for mass analyzing the ion beam along the beamline, and an accelerator is positioned along the beamline and configured to accelerate the ion beam from a first energy to a second energy.

A charge stripping apparatus, for example, is provided in the system and is configured to strip at least one electron from the first charge state ions along the beamline, thereby defining a stripped ion beam comprising second charge state ions and the trace metal ions. A charge selector apparatus, for example, is positioned downstream of the charge stripping apparatus along the beamline and configured to select the second charge state ions in the stripped ion beam to define a final ion beam along the beamline, wherein the final ion beam comprises the second charge state ions and approximately zero trace metal ions. Further, an end station can be provided and located along the beamline and configured to support a workpiece that is to be implanted with the second charge state ions.

In one example, the accelerator comprises a plurality of accelerator stages, wherein the charge stripping apparatus is positioned downstream of at least one of the plurality of accelerator stages. The plurality of accelerator stages, for example, can be comprised of multiple acceleration stages defined within an individual accelerator apparatus. Alternatively, the plurality of accelerator stages can be defined by or within a plurality of individual accelerator apparatuses. The charge selector apparatus, for example, can be further positioned between at least two of the plurality of acceleration stages. The ion implantation system, for example, can further comprise an energy filter positioned downstream of the accelerator, wherein the energy filter is further configured to filter the final ion beam.

In another example, a scanner is provided in the system and configured to reciprocally scan the final ion beam to define a scanned ion beam. The scanner can comprise an electrostatic scanner or an electromagnetic scanner configured to respectively electrostatically or electromagnetically scan the final ion beam to define the scanned ion beam.

According to yet another aspect, a method for implanting high charge state ions into a workpiece while mitigating trace metal contamination is provided. The method, for example, comprises generating desired ions of a desired species in an ion source, wherein the desired ions are at a first charge state, and wherein generating the desired ions further generates trace metal ions of a contaminant species, wherein a charge-to-mass ratio of the desired species and the contaminant species is equal. The desired ions and trace metal ions are extracted from the ion source, thereby defining a first ion beam. In one example, the first ion beam is mass analyzed, thereby defining a mass analyzed ion beam. In one example, the mass analyzed ion beam is accelerated. The mass analyzed ion beam, for example, is passed through a charge stripping element, wherein the charge stripping element strips at least one electron from the desired ions, thereby defining a second ion beam comprising the desired ions at a second charge state and the trace metal ions. The second ion beam is passed through a charge selector element, thereby defining a final ion beam comprising the desired ions at the second charge state and no trace metal ions. Further, the desired ions are of the second charge state are implanted into the workpiece.

DETAILED DESCRIPTION

Ion implantation is a physical process, as opposed to diffusion, which is a chemical process that is employed in semiconductor apparatus fabrication to selectively implant dopant into a semiconductor workpiece and/or wafer material. Thus, the act of implanting does not rely on a chemical interaction between a dopant and the semiconductor material. For ion implantation, dopant atoms/molecules are ionized and isolated, sometimes accelerated or decelerated, formed into a beam, and swept across a workpiece or wafer. The dopant ions physically bombard the workpiece, enter the surface and typically come to rest below the workpiece surface in the crystalline lattice structure thereof. Commonly-owned U.S. Pat. No. 8,035,080 to Satoh describes various systems and method for increasing beam current, the contents of which are herein incorporated by reference, in their entirety.

The present disclosure appreciates that high energy implant applications (e.g., used in the formation of image sensors) can be very sensitive to metal contamination. High energy applications can often call for the use of higher-charge state ions (e.g., arsenic ions), such as triple-charged (e.g., As 3+), quadruple-charged (e.g., As 4+), or even higher-charged ions in order to obtain higher final energy implants. However, generating and extracting such higher-charge state ions can create a higher risk of forming trace metal ions in the extracted ion beam.

For example, ion implantation is used for integrated circuit (IC) manufacturing of some devices, such as CMOS image sensors (CISs), that are very sensitive to metal contamination, where such contamination can impact device performance, like so-called white pixels and dark current performance issues. Lower levels of metal contamination, such as surface metal contamination and energetic metal contamination, are increasingly being desired from high energy ion implantations for CIS device fabrication. In a high-energy ion implantation system, a multiple-charge state ion, for example, is used to obtain higher final implantation energy through acceleration stages. However, extraction of higher charge state ions from an ion source for implantation leads to a potential "energetic metal contamination risk", whereby a small, but traceable, amount of one or more contaminant ions generated from the ion source can gain energy and pass through the analyzing magnet, electrical filter, and velocity filter, and ultimately, be implanted into the workpiece.

The present disclosure appreciates that such trace metal ions in the ion beam can be undesirable in such implants, as the trace metal ions are implanted into the workpiece along with the desired higher-charged ions, causing potential problems in the resulting IC. Heretofore, some of these trace metal contamination ions have not been able to be filtered from the desired high charge state ion beam. For example, in extracted arsenic ion beams from an ion source, arsenic triple charge ($_{75}$As 3+) ions and titanium double charge ($_{50}$Ti 2+) ions generated inside the ion source generally cannot be distinguished by a downstream analyzing magnet, electrical filter, and velocity filter, because they both have same magnetic rigidity, energy to charge ratio, and velocity. As such, both ions will reach the workpiece, thus causing energetic metal ions (e.g., Ti contamination) being implanted into the workpiece. Another similar example is iron triple charge ($_{56}$Fe 3+) ions that, in general, cannot be separated by the downstream analyzing magnet when it is configured to select arsenic quadruple charge ($_{75}$As 4+) ions.

The present disclosure provides a solution to the trace metal contamination by starting with selected lower-charge state ions from the extracted ion beam (e.g., $_{75}$As 3+) and then stripping, for example, one electron during transport of the ion beam to create a desired higher-charge state ion beam (e.g., $_{75}$As 4+). For example, by starting with lower-charge state ions and selecting the desired higher-charge state ions after a charge stripping process, trace metal contamination ions that initially accompanied the selected lower-charge states ions can be separated from the desired higher-charge state ions while the higher charge-state ions can be further accelerated, if necessary, to a final energy for implant. By doing so, the present disclosure, for example, can reduce an amount of trace metal ions initially formed in the ion source due to a lower arc power that can be used for lower-charge state ion generation, while also providing a filtering mechanism to remove the trace metal ions from the desired higher-charge state ions prior to being implanted into the workpiece, thus resulting in reduced trace metal contamination in the workpiece.

In order to mitigate such contamination, the present disclosure provides a charge stripper configured to obtain the charge state of a desired ion, such that a contaminant ion (e.g., a Ti or Fe ion described above) can be separated by selecting the desired ion after charge stripping, downstream along the beamline.

Figure 1A:
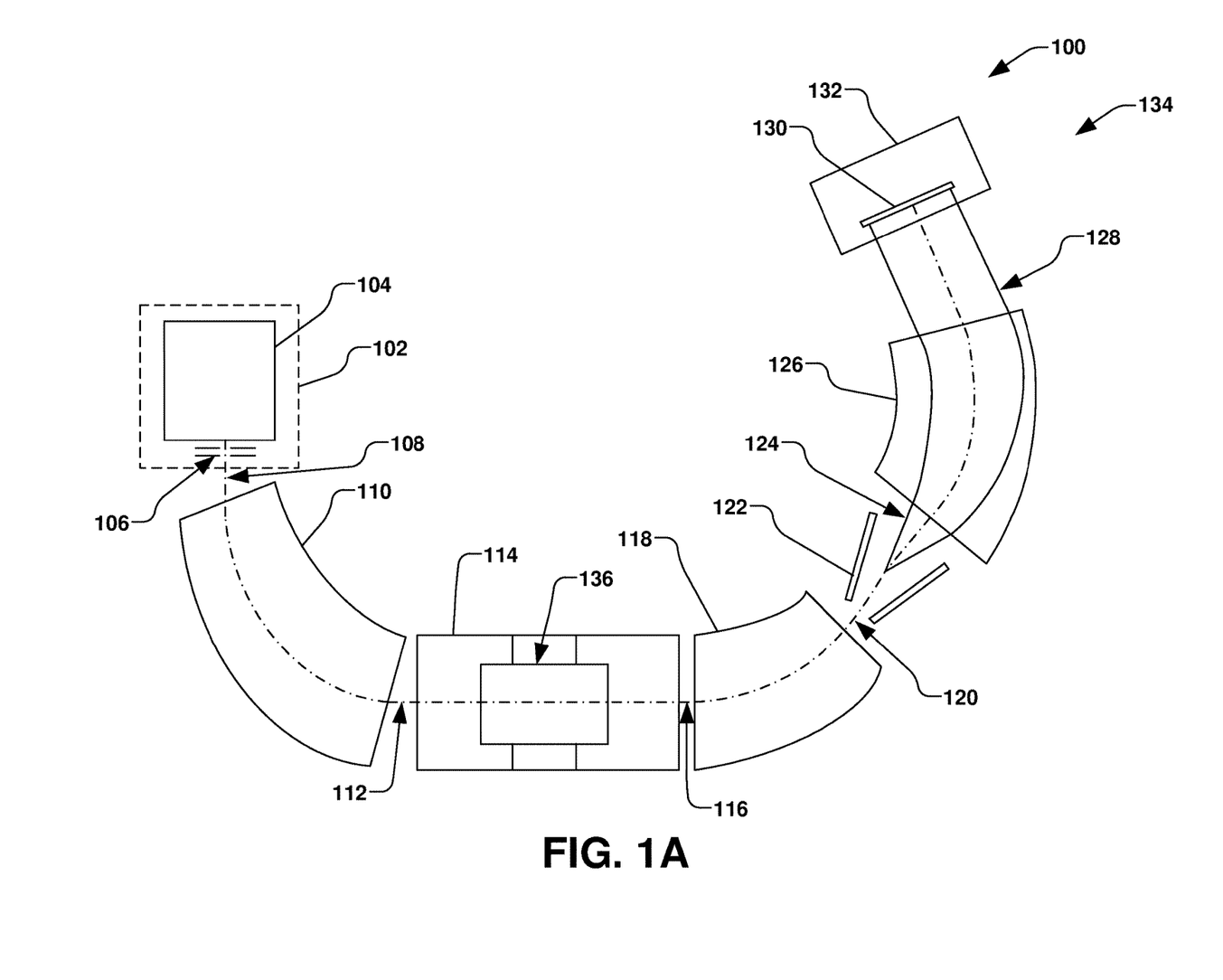
FIG. 1A is a simplified top view illustrating an ion implantation system in accordance with an aspect of the present disclosure.
Figure 1B:
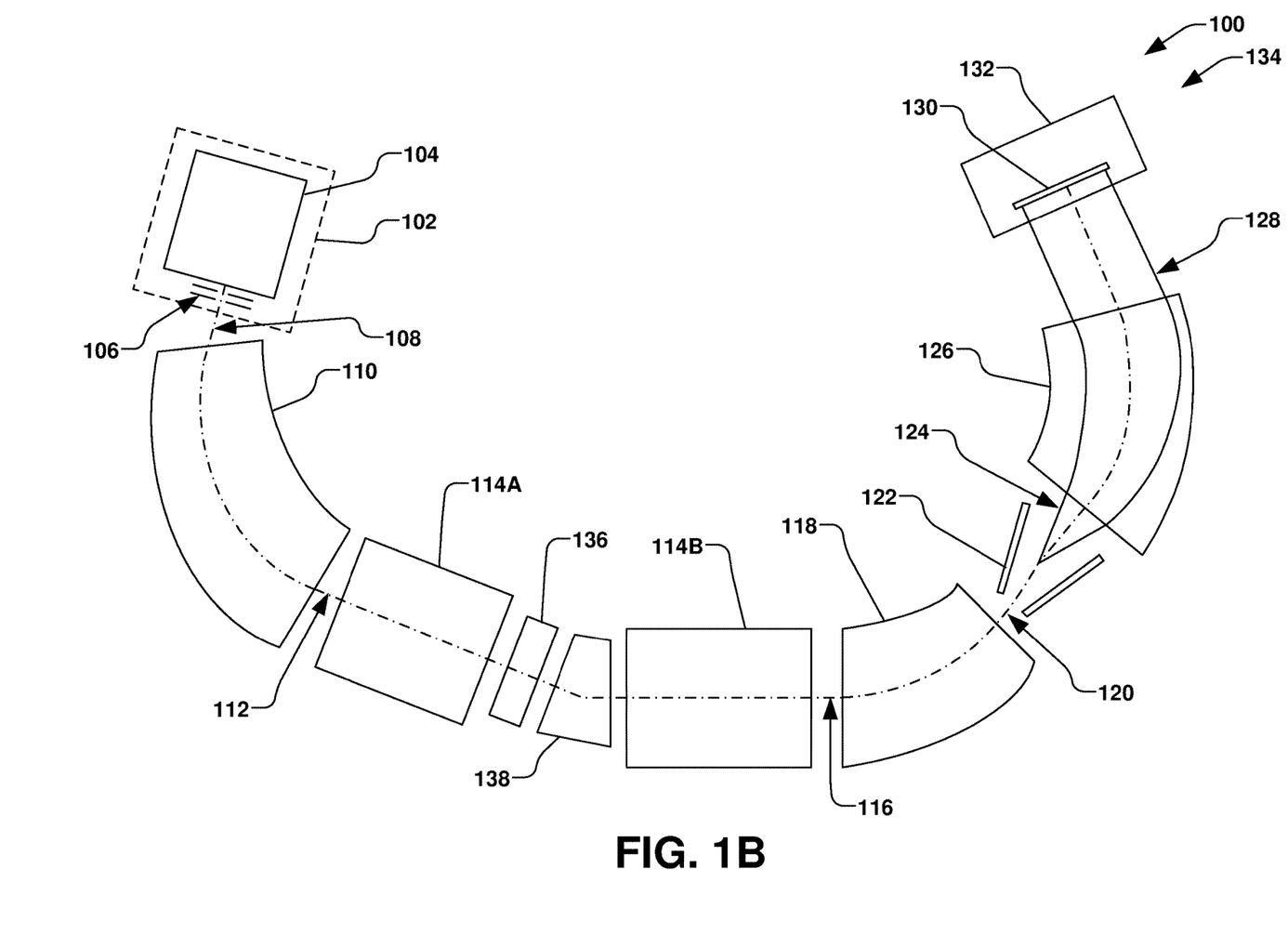
FIG. 1B is a simplified top view illustrating an ion implantation system having a charge stripper after an accelerator in accordance with an aspect of the present disclosure.

Referring now to the figures, in order to gain a better understanding of the present disclosure, FIGS. 1A-1B illustrate example ion implantation systems 100 in accordance with various exemplified aspects of the present disclosure. The ion implantation system 100, for example, can sometimes be referred to as a post acceleration implanter, as will be discussed infra.

The ion implantation system 100 of FIG. 1A, for example, comprises a source chamber assembly 102, which comprises an ion source 104 and an extraction electrode 106 to extract and accelerate ions to an intermediate energy and generally forming an ion beam 108. A mass analyzer 110, for example, removes unwanted ion mass and charge species from the ion beam 108 to define an analyzed ion beam 112, whereby an accelerator 114 is configured to accelerate the analyzed ion beam to a define an accelerated ion beam 116. In accordance with one example of the present disclosure, the accelerator 114, for example, comprises an RF linear particle accelerator (LINAC) in which ions are accelerated repeatedly by an RF field. Alternatively, the accelerator 114 comprises a DC accelerator (e.g., a tandem electrostatic accelerator), in which ions are accelerated with a stationary DC high voltage.

The ion implantation system 100, for example, further comprises an energy filter 118 positioned downstream of the accelerator 114, wherein the energy filter is configured to remove unwanted energy spectrum from the accelerated ion beam 116 emerging from the output of accelerator 114 to define a final energy ion beam 120. A beam scanner 122, for example, is configured to scan the final energy ion beam 120 exiting from the energy filter 118, whereby the final energy ion beam is scanned back and forth at a fast frequency to define a scanned ion beam 124. The beam scanner 122, for example, is configured to electrostatically or electromagnetically scan the final energy ion beam 120 to define the scanned ion beam 124.

The scanned ion beam 124 is further passed into an angle corrector lens 126, wherein the angle corrector lens is configured to convert the fanning-out scanned beam 124 to a final ion beam 128. The angle corrector lens 126, for example, can be configured to parallelize and shift the scanned ion beam 124 to define the final ion beam 128. The angle corrector lens 126, for example, can comprise electromagnetic or electrostatic devices configured to define the final ion beam 128.

The final ion beam 128, for example, is subsequently implanted into a workpiece 130 (e.g., a semiconductor wafer) that can be selectively positioned in a process chamber or end station 132. The workpiece 130, for example, can be moved orthogonal to the final ion beam 128 (e.g., moving in and out of the paper) in a hybrid scan scheme to irradiate the entire surface of the workpiece 130 uniformly. It is noted that the present disclosure appreciates various other mechanisms and methods for scanning the final ion beam 128 with respect to the workpiece 130, and all such mechanisms and methods are contemplated as falling within the scope of the present disclosure.

The ion implantation system 100 of FIGS. 1A-1B, for example, can be configured as a hybrid parallel-scan single-workpiece ion implantation system. The implantation system 100 for example, can also referred to as a post-acceleration implanter 134, since the main accelerator 114 is positioned downstream of the mass analyzer 110 and upstream of the energy filter 118. Ion implanters of this type, for example, provide the energy filter 118 after the accelerator 114 in order to remove unwanted energy spectrum in the output of accelerator. It should be noted, however, that the present disclosure appreciates that various aspects of the present disclosure may be implemented in association with any type of ion implantation system, including, but not limited to the exemplary system 100 of FIGS. 1A-1B.

In one example, the final kinetic energy of ion particles passing through the accelerator 114 can be increased by increasing the ion charge value (q). The ion charge state (q) can be increased in one embodiment by providing a charge stripper 136 within the accelerator 114 as shown in FIG. 1A, or between two accelerators 114A and 114B, as shown in FIG. 1B. The accelerator 114, for example, can take many forms and can comprise any number of accelerator stages defined by or within a single accelerator apparatus, such as illustrated in the example shown in FIG. 1A, or by or within multiple accelerator apparatuses, such as illustrated in the example shown in FIG. 1B. For example, in an accelerator 114 that is an RF accelerator, as shown in FIG. 1A, a number of accelerator stages (e.g., six or more) can comprise resonators for generating an accelerating field (not shown), and at least one of the accelerator stages can comprise the charge stripper 136 replacing the resonator(s) at that accelerator stage.

In another example, acceleration of the ion particles can occur before the charge stripper 136 located within the accelerator 114, for example, through a first plurality of acceleration stages within the accelerator. Acceleration can also occur after the charger stripper 136, for example, through a second plurality of acceleration stages within the accelerator 114. Alternatively, the first plurality of acceleration stages may be external to the accelerator 114. For example, while not shown, the first plurality of acceleration stages can be associated with the mass analyzer 110, and thus, the ion beam 108 is both accelerated and mass analyzed before entering the charge stripper 136.

In another example, the charge stripper 136 can be located downstream, or after, a first accelerator 114A, as shown in FIG. 1B. A charge selector 138, for example, is positioned after the charge stripper 136 in order to select desired ions with a higher charge state after the stripping process. The selected higher-charge state ions can thus enter a second accelerator 114B in order to gain maximum energy that is higher than the original-charge state ions. In comparing the configurations of FIG. 1A and FIG. 1B, the charge selector 138 shown in FIG. 1B, for example, can be configured to select only a specific ion charge state of the desired ion species, while preventing other charge state ions from entering the second accelerator 114B. Thus, in some circumstances, the configuration of the system 100 shown in FIG. 1B can significantly purify an energy spectrum of the desired ions after full acceleration, as compared to the configuration illustrated in FIG. 1A.

In one example, the mass analyzed ion beam 112 of FIG. 1A comprises positive ions comprising a first charge state (e.g., $_{75}$As 3+) where the net electrical charge of the ions can be positive. After entering the charge stripper 136, a fraction of the positive ions of the first charge state can be converted into more positive ions of a second charge state (e.g., $_{75}$As 6+). Consequently, the accelerated ion beam 116 exiting the accelerator 114 comprises a lower concentration of the positive ions of the first charge state, and a concentration of ions of the second charge state at an energy that is above the kinetic maximum energy level available using the first charge state. The concentration of the second charge state ions converted from the charge stripping process in the charge stripper 136, for example, can be higher compared to direct extraction of such second charge state ions from the ion source 104. The ion beam 108 extracted from the ion source 104, for example, can comprise any beam species, such as arsenic, boron, phosphorus, or other species.

Figure 2:
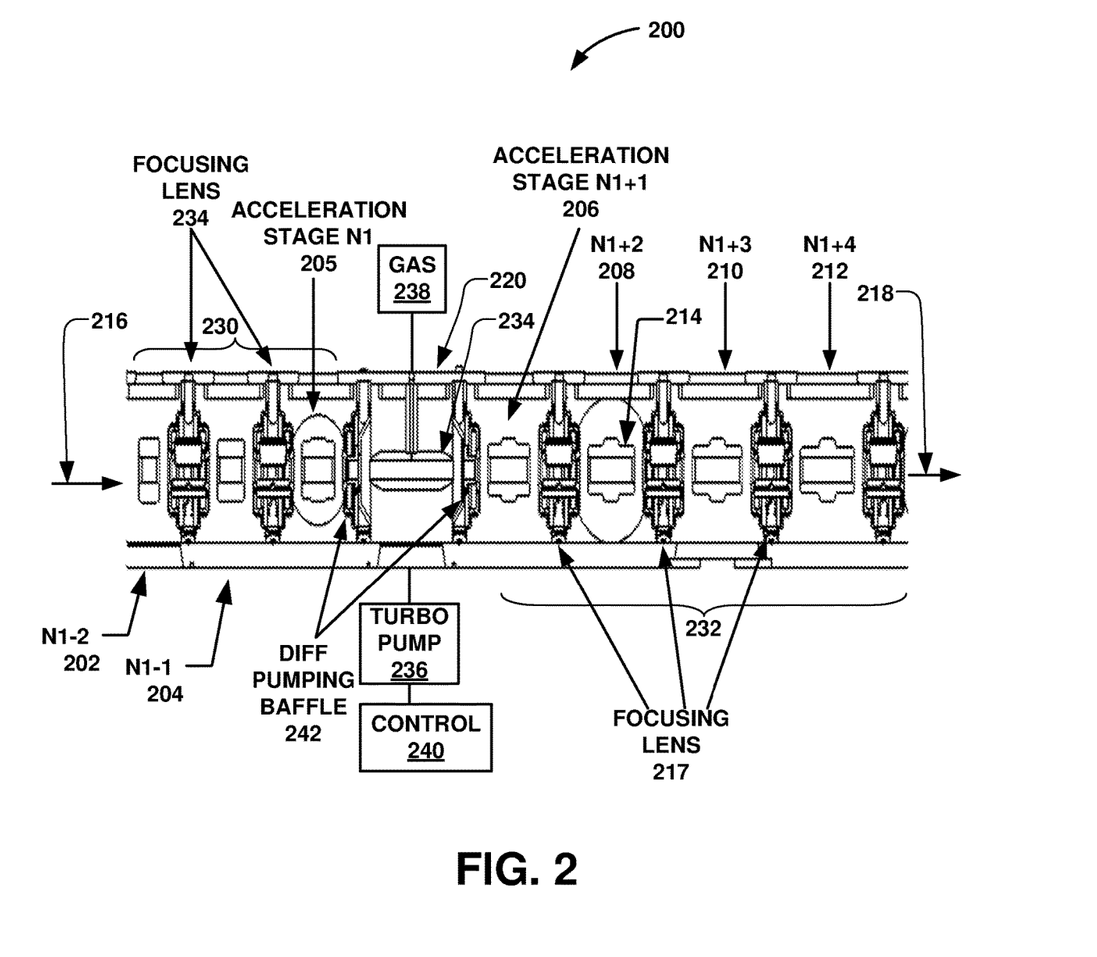
FIG. 2 is a portion of an ion implantation system according to at least one aspect of the present disclosure.

FIG. 2 illustrates one example of a portion of an example accelerator 200 of an ion implantation system in accordance with one aspect of the disclosure. For example, the accelerator 200 can comprise an RF accelerator, and can comprise any number of accelerator stages, shown in the present example as accelerator stages 202, 204, 205, 206, 208, 210, and 212. The accelerator stages 202, 204, 205, 206, 208, 210, and 212 can respectively comprise at least one accelerator electrode 214 which is driven by an RF resonator, for example, for generating a RF accelerating field (not shown) on both sides thereof. An inbound ion beam 216 of charged particles with a charge state (e.g., a net electrical charge or a valence) can pass through apertures of the accelerator electrode in succession. The principles of acceleration are well known in the art.

Beam focusing can be provided by lenses 217 (e.g., electrostatic quadrupoles) incorporated within the accelerator 200. In one embodiment, the accelerator 200 can accelerate singly-charged ions to a maximum kinetic energy level for a first charge state. In one embodiment, ions of a higher second charge state can be employed to reach higher energy levels than the maximum kinetic energy level for a lower first charge state. Thus, the inbound ion beam 216 comprising ions of the first charge state can enter the accelerator 200 as an entering beam and be converted to ions of a second charge state of a higher or lower net charge valence. By removing electrons therein, as by a charge stripper 220 incorporated within the accelerator 200, the inbound ion beam 216 can be converted to an outbound ion beam 218 comprising ions of the second higher charge state (e.g., $_{75}$As 3+ converted to $_{75}$As 6+), thereby increasing beam energy beyond the maximum kinetic energy level for the first charge state.

Once the inbound ion beam 216 has been extracted and formed, for example, the inbound ion beam may be accelerated by the accelerator 200 (e.g., a 13.56 MHz twelve resonator RF linear accelerator). There is no one particular accelerator or type of linear accelerator (LINAC) that the present disclosure is confined to. In one embodiment, the accelerator 200 can comprise a first plurality of accelerator stages 230 integrated in the accelerator 200 for accelerating the inbound ion beam 216 therein and a second plurality of accelerator stages 232 integrated in the accelerator 200 for further accelerating the inbound ion beam 216 to exit the accelerator 200 as outbound ion beam 218. While the first plurality of accelerator stages are integrated in the accelerator 200 and upstream of the charge stripper 220 in the illustrated example of FIG. 2, the first plurality of accelerator stages 230 may be alternatively located before a mass analyzer (e.g., mass analyzer 110 of FIG. 1). Thus, the charge stripper 220, for example, can be located at any of the acceleration stages of the accelerator 200 as long as the first plurality of accelerator stages provide enough energy to the ions of the first charge state, such that the energy is high enough to yield a high stripping efficiency for the production of the ions of the second charge state in a concentration greater than the amount available at the ion source.

For example, resonators of an RF accelerator can be replaced at any acceleration stage with the charge stripper 220. In one embodiment, for example, the charge stripper 220 can be located downstream of at least one of the first plurality of accelerator stages 230 of the accelerator in a direction of the inbound ion beam 216, and upstream of at least one of the second plurality of accelerator stages 232 of the accelerator 200. In other embodiments, for example, the first plurality of accelerator stages 230 of the accelerator 200 can comprise more or less accelerator stages than the second plurality of accelerator stages 232. Alternatively, the first plurality of accelerator stages 230 of the accelerator 200 can comprise an equal number of accelerator stages than the second plurality of accelerator stages 232. The number of stages is not confined to the example illustrated in FIG. 2.

In a further embodiment, the inbound ion beam 216 entering the accelerator 200 comprises a positive ion beam of the first charge state, and the outbound ion beam 218 comprises a positive ion beam of the second charge state that comprises a more positive charge state than the first charge state. The inbound ion beam 216 can enter the charge stripper 220 which, for example, comprises a stripper tube 234 (e.g., a thin tube filled with a heavy molecular weight gas). The charge stripper 220, for example, can also comprise a pump 236 (e.g., a differential turbo pump) for pumping a gas from a gas source 238 to reduce or control the amount of gas flow into adjacent accelerator sections. The gas, for example, comprises sulfur hexafluoride ($SF_6$) or another high molecular weight gas for efficiently stripping electrons from the inbound ion beam 216 and generating a higher concentration of ions within the outbound ion beam 218 that comprise a higher positive charge state. The charge stripper 220 and/or pump 236, for example, can comprise a control device 240 configured to adjust a flow rate of the gas from the gas source 238 into the charge stripper 220. The flow rate of the gas can be a functionally based on at least one of energy, current, and/or species of the inbound ion beam 216. The charge stripper 220 can further comprise a pumping baffle 242 (e.g., a differential pumping baffle) on both sides of the charge stripper 220. The pumping baffle 242, for example, can function to minimize a gas leak into adjacent accelerator stages (e.g., accelerator stages 205 and 206) together with the differential pump 236.

For example, an accelerated ion beam by a first linear accelerator (LINAC) is directed to a layer of gas configured to strip away electrons surrounding the ions in the charge stripper 220 in order to increase the charge state of the ions to achieve a higher energy gain through a second LINAC. For example, for the top energy range of arsenic (As), 3+ arsenic ions that are accelerated through the first LINAC are stripped to 6+ arsenic ions by the charge stripper 220. As such, approximately 8% of 7 MeV 3+ arsenic ions, for example, are converted to 6+ arsenic ions. However, if the conversion were to be more efficient, more 6+ beam current could be achieved.

Tandem high energy accelerators generally rely on charge stripping to produce high energy ions, whereby such tandem high energy accelerators have conventionally utilized argon gas for such charge stripping. On so-called "ultra-high energy" tandem accelerators, extremely thin carbon foil has also been utilized as a charge stripper, but the short life time of the carbon foil has limited applicability in any industrial use of ion implantations and is presently known to be solely used on academic research accelerators. For example, charge stripping capabilities associated with passing a 10 MeV iodine ion beam through various gases and foils is provided for in the graph 300 shown in FIG. 3.

Figure 4:
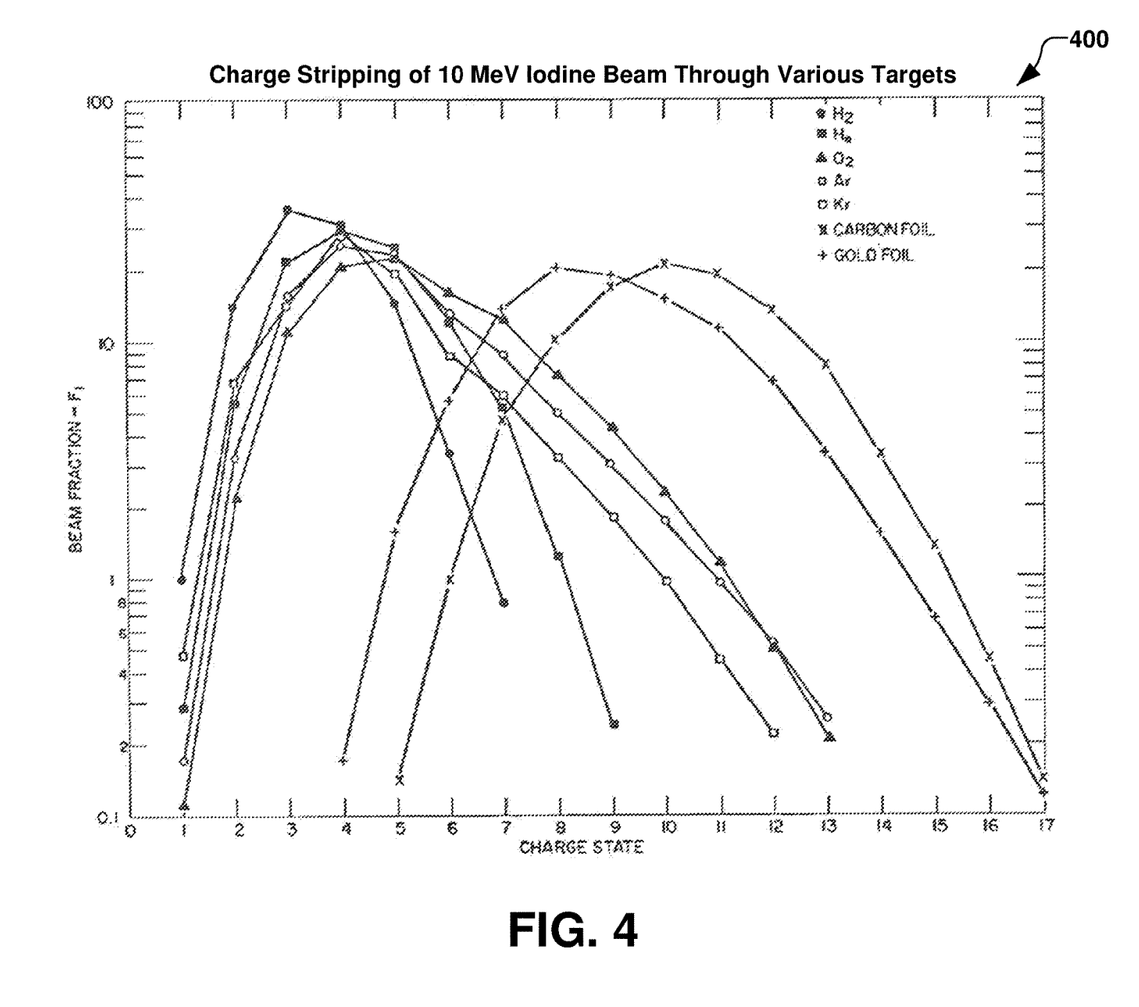
FIG. 4 illustrates various medium used in stripping charge.

Heretofore, stripping of ions has been generally limited to the gases such as those shown in graph 400 of FIG. 4, and primarily, to the utilization of argon gas. Sulfur hexafluoride ($SF_6$) gas, for example, can be advantageously utilized for stripping arsenic ions in a gas stripper, whereby the charge state distribution tends to shift to higher charge states and therefore, the yield of the 6+ ions, for example, are almost twice that conventionally seen with argon gas.

Figure 3:
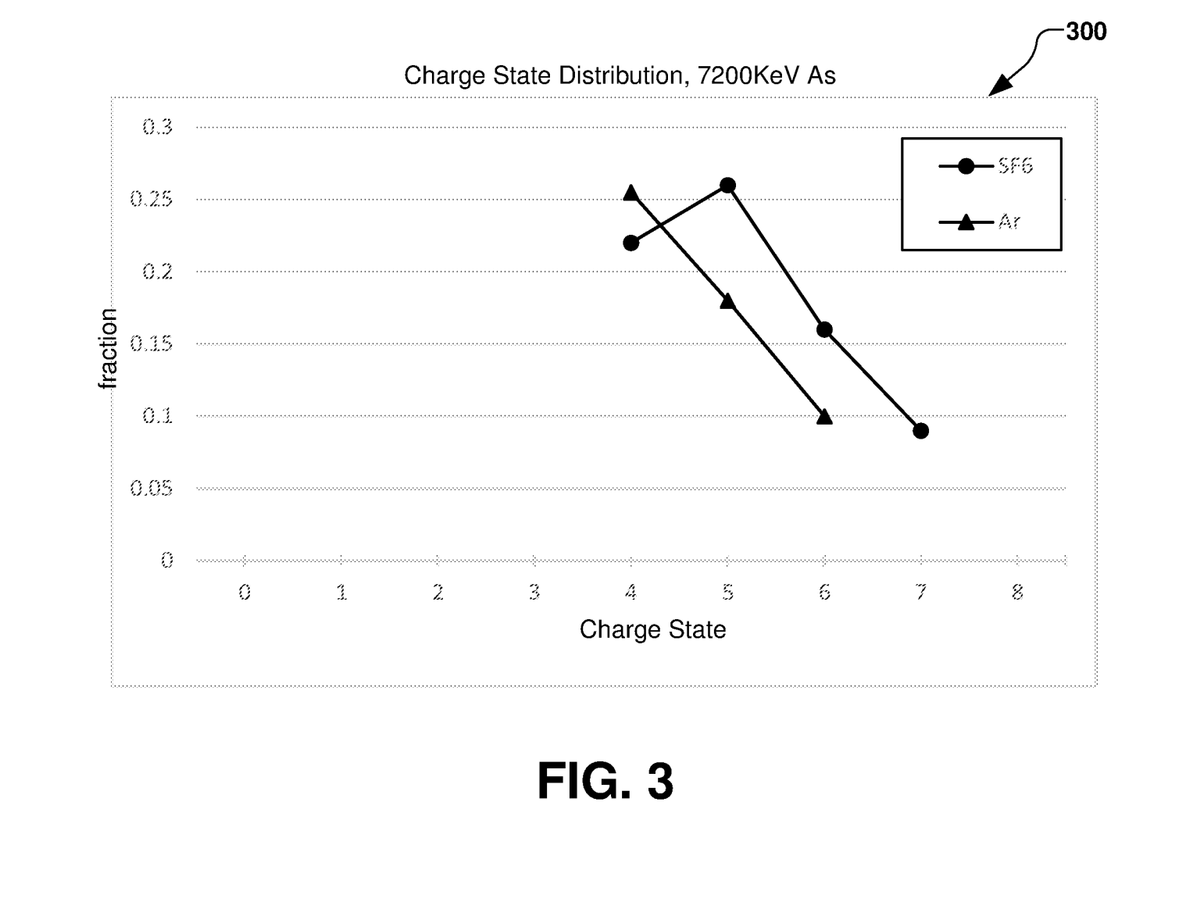
FIG. 3 illustrates a charge state distribution of an arsenic beam through argon and sulfur hexafluoride.

The graph 300 shown in FIG. 3, for example, illustrates a comparison of the charge state distribution after passing a 7200 KeV arsenic 3+ ion beam through a gas stripper containing $SF_6$ and through a gas stripper containing argon in accordance with one example. As is shown, use of $SF_6$ doubles the 5+ and 6+ ion yields, thus increasing the final beam current of 5+ and 6+ ion beam by factor of two. Such an increase in efficiency is evident, when utilizing argon in the stripper for 6+ ions, an approximately 8% conversion is achieved, while utilizing $SF_6$ provides an approximately 16% conversion, or approximately double the amount of the 6+ beam.

A gas stripper, for example, operates by passing ions through a material, whereby if the ions are passed through the material at a fast enough speed, an interaction with the background gas or solid film atoms in the stripper causes the ion beam to tend to lose electrons. As such, the ion beam emerges from the stripper at a higher charge, depending on how fast the ions enter the stripper. While a gas stripper can be desirable in some circumstances, the present disclosure further contemplates utilization of a thin film stripper employing a very thin carbon film to provide a higher population of higher charged ions. However, as compared to a gas stripper, a thin film stripper can potentially have a shorter lifetime, based on process requirements.

In an example gas stripper, in general terms, a tube is provided within the gas stripper, whereby a stripping gas is fed to the center of the tube, wherein the gas has a higher gas density than the surrounding vacuum. At ends of the tube, a vacuum is provided (e.g., by a vacuum pump), such that the minimum amount of stripping gas propagates to the rest of the system. As such, a higher pressure region is provided within the stripper, whereby the accelerated arsenic ions pass through the higher pressure region and interact with the stripping gas atoms, thus stripping electrons from the ions and producing a higher charge of ions emanating from the stripper. Such higher-charged ions may be also advantageously utilized in a tandem accelerator.

For example, argon has a molecular weight of approximately 40, while $SF_6$ is substantially heavier with a molecular weight of approximately 146. As such, one theory is that the heavier the gas utilized in the stripper, the greater the efficiency of stripping electrons from the ion beam. $SF_6$ is one of the heavier gas molecules more readily available for commercial use, and is thus considered advantageous over other heavier gases. However, other heavy molecular weight gases (e.g., heavier than argon) may be similarly utilized for electron stripping. $SF_6$, for example, may be advantageous as it is gas that is efficient at suppressing high voltage arc.

Heretofore, $SF_6$ would not have been considered a desirable gas to use in a gas stripper or elsewhere in the beamline.

For example, $SF_6$ is environmentally toxic, and would be concerning if the gas were to be pumped out to atmosphere, or otherwise escape containment within the gas stripper. The present disclosure thus further contemplates breaking down $SF_6$ into its less toxic and/or less volatile constituents. Alternatively, the $SF_6$ could be recycled and used again.

It is appreciated that the conventional use of $SF_6$ has been to suppress arcs outside of the beamline in a tank for high voltage insulation, whereas utilizing $SF_6$ within the beamline to strip electrons, wherein the beamline provides a significantly different environment and application than previous uses of $SF_6$. Conventionally, one of ordinary skill would not have been motived to use of $SF_6$ in high voltage regions in the vacuum of the beamline, as doing so could make holding of voltages difficult. For example, it is appreciated that when $SF_6$ is provided in a vacuum, it tends to induce a spark, thus making its use in the gas stripper counterintuitive, as one of ordinary skill would not desire the presence of $SF_6$. In the beamline, as it would be assumed to cause deleterious arcing or sparking.

$SF_6$ can advantageously provide an additional benefit in the gas stripper, as $SF_6$ is a heavier gas than the argon gas used in conventional gas strippers, whereby the $SF_6$ advantageously aids in localizing the high-pressure region due to lower conductance through a tube, which is inversely proportional to square root of the molecular weight of the gas. For example, $SF_6$ can be fed to the middle of a tube of the gas stripper to create a localized high-pressure region. If a lighter gas such as hydrogen were to be used in the gas stripper, it would quickly diffuse and be difficult to localize.

According to one or more examples, various systems and methods are provided herein to increase beam current available at a maximum kinetic energy for a charge state without using a higher or different charge state at an ion source. For example, an ion source of an ion implantation system can comprise ions (e.g., arsenic ions) of a particular charge state (e.g., $_{75}As$ 3+) for generating an ion beam therefrom. Processes within the ion implantation system (such as within an accelerator located along a beam path) can act to cause ions to change their initial charge value (e.g., a charge exchange reaction). For example, in one embodiment, an arsenic ion comprising a net positive charge of three can be selected into the accelerator and stripped of electrons by a charge stripper comprising a gas source and a turbo pump. The gas source, in accordance with the present disclosure, comprises a high molecular weight gas, such as sulfur hexafluoride ($SF_6$).

In one embodiment, the accelerator can comprise a number of accelerator stages and a charge stripper therein. When a high-speed ion comes in close proximity to another molecule or atom of a gas within the charge stripper, the ion may pick up an electron from the molecule or atom (i.e., an electron capture reaction), or may lose an electron to the molecule or atom (i.e., a charge stripping reaction). The former reaction reduces the value of ion charge by one; for example, a singly charged ion can become a neutral, that is, an electrically neutral atom. The latter increases the value of ion charge by one (e.g., a singly charged ion becomes a doubly charged ion).

In one embodiment, positive ions (e.g., arsenic ions) comprising a first positive charge state (e.g., +3 net positive charge or valence) are drawn into an accelerator comprising a charge stripper and a plurality of acceleration stages. The respective acceleration stages may comprise RF resonators for generating RF accelerating fields to accelerate ions along a beam path. The charge stripper can comprise a gas source for emitting a high molecular weight gas (e.g., $SF_6$) into the accelerator and a turbo pump for creating a vacuum to exit the gas and prevent gas flow into acceleration stages. The charge stripper can replace one of the acceleration stages within the accelerator in order to strip ions of an electron, and thus, cause the positive ions entering the accelerator to convert to more positive ions of a second charge state (e.g., +6 net positive charge or valence) exiting the accelerator.

Figure 5:
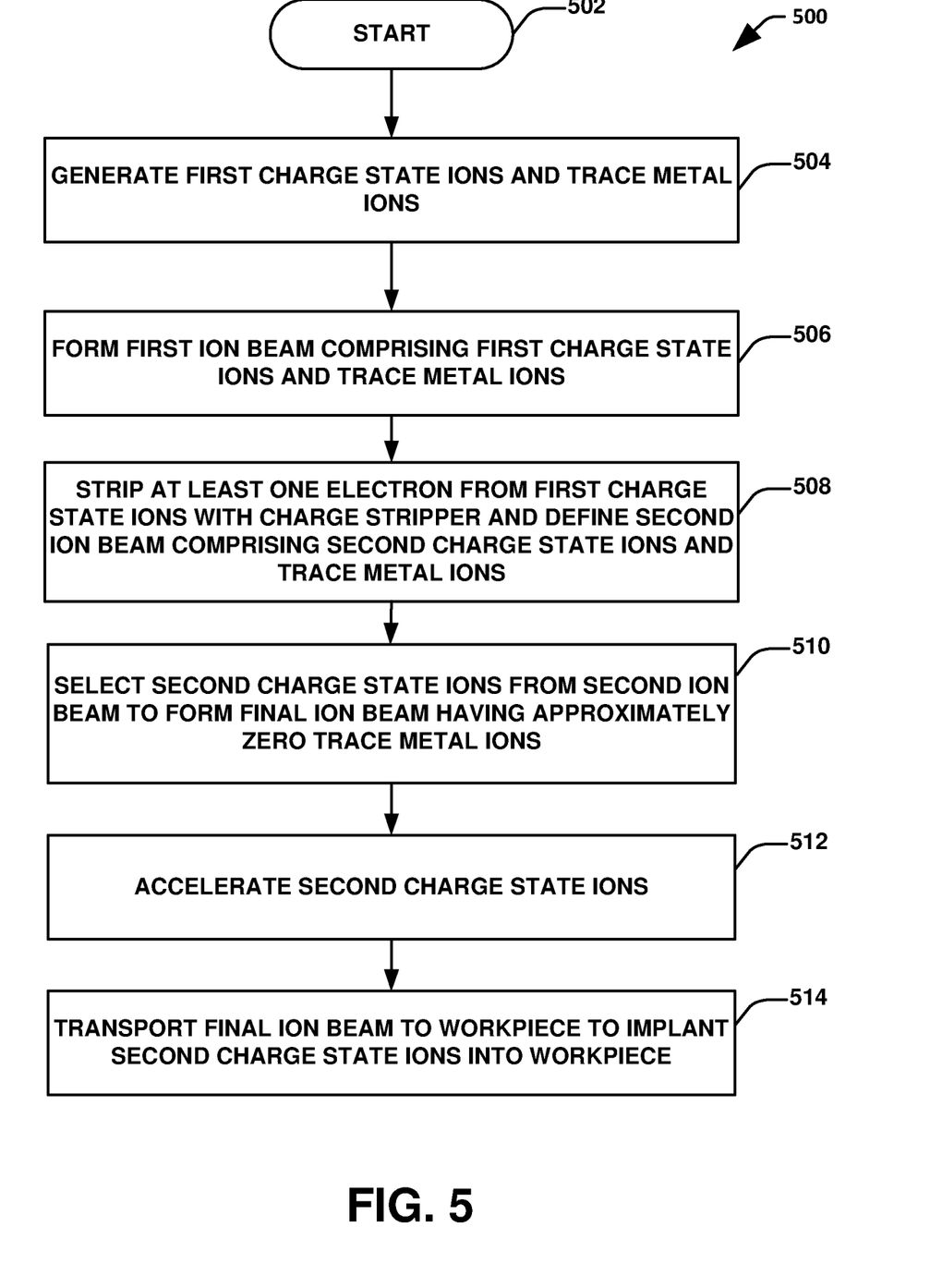
FIG. 5 is a flow chart diagram illustrating a method of decreasing metal contamination according to another example of the present disclosure.
Figure 6:
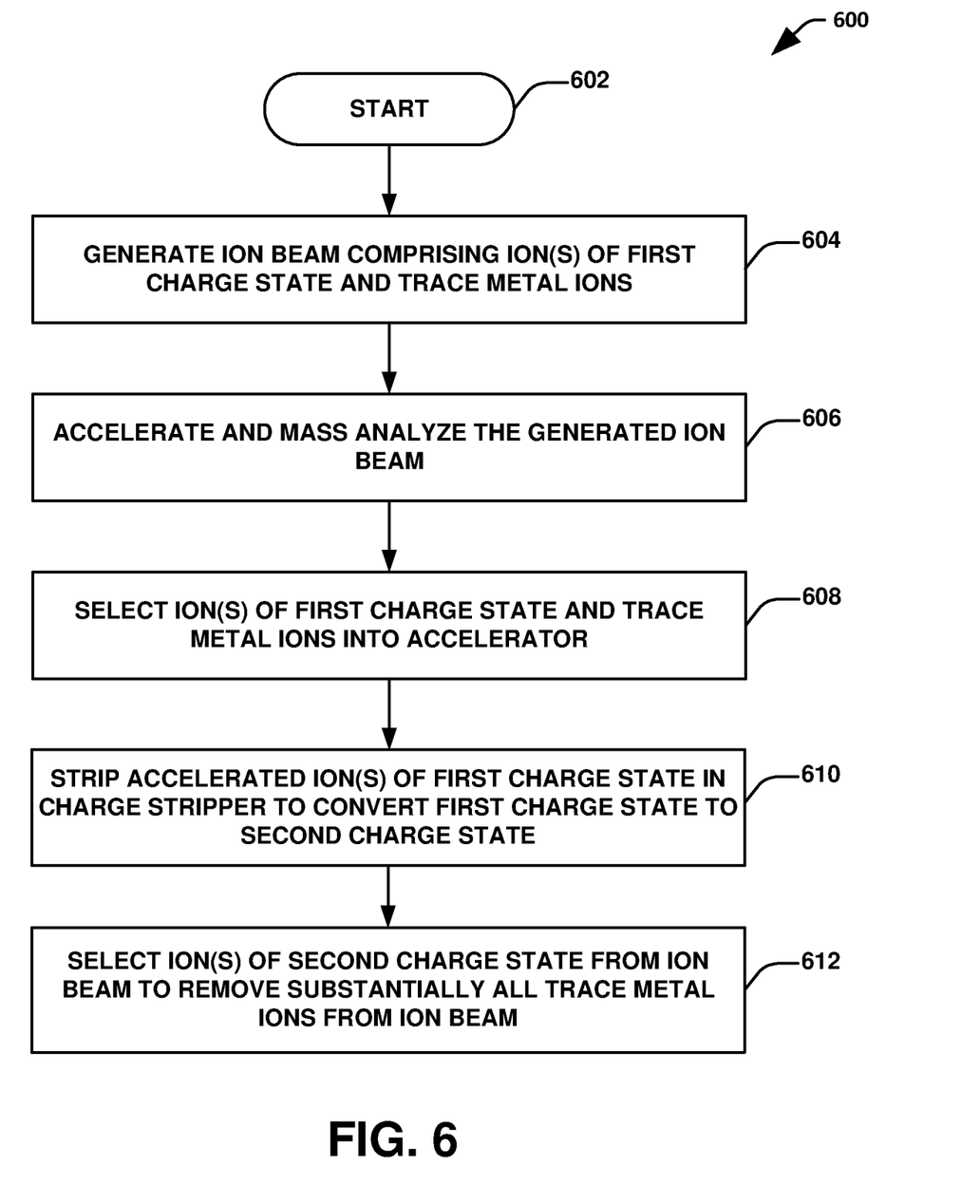
FIG. 6 is a flow chart diagram illustrating a method of decreasing metal contamination according to yet another example of the present disclosure.

Referring now to FIG. 5 and FIG. 6, various methods 500, 600 are provided for controlling contamination and increasing ion beam current at a substantially high energy for a desired charge state. It should also be noted that while an exemplary method(s) 500 and 600 are illustrated and described herein as a series of acts or events, it will be appreciated that the present disclosure is not limited by the illustrated ordering of such acts or events, as some steps may occur in different orders and/or concurrently with other steps apart from that shown and described herein, in accordance with the disclosure. In addition, not all illustrated steps may be required to implement a methodology in accordance with the present disclosure. Moreover, it will be appreciated that the methods may be implemented in association with the systems and apparatuses illustrated and described herein as well as in association with other systems not illustrated.

The method 500 of FIG. 5 initiates at 502. In act 504, an ion source generates first charge state ions and trace metal ions, whereby in act 506, a first ion beam is extracted or otherwise formed comprising the first charge state ions and trace metal ions. The first ion beam formed in act 506, for example, can be directed into a mass analyzer, whereby the first ion beam is mass analyzed. The magnetic field strength for the mass analyzer can be selected according to a charge-to-mass ratio. The mass analyzing can be downstream of the ion source, in one example.

In one example, first charge state ions and trace metal ions with the same magnetic rigidity can be selected (e.g., via the mass analyzer) to enter into an accelerator. The selected first charge state ions are accelerated to an energy that yields a higher stripping efficiency to a higher charge state than available at ion source. In act 508, after acceleration to a higher energy, at least one electron is stripped from the first charge state ions via a charge stripper, thus defining a second ion beam comprising second charge state ions and the trace metal ions. In act 510, the second charge state ions are selected from the second ion beam to form a final ion beam comprised of primarily the second charge state ions with approximately zero trace metal ions. It is noted that "approximately zero" trace metal ions is indicative of a substantial decrease in trace metal ions in the final ion beam, as compared to an amount of trace metal ions in the first or second ion beam. Thus, "approximately zero" can be interpreted as zero trace metal ions or a substantially small number of trace metal ions such that it can be considered insignificant to the ion implantation. In one example, positive ion(s) of second positive charge state(s) may be further accelerated at 512 to a final energy. Thus, the present disclosure provides approximately a 50% to 100% removal of the trace metal ions from the second ion beam prior to the final ion beam implanting the second charge state ions into a workpiece in act 514.

Referring to FIG. 6, the method 600 of FIG. 6 initiates at 602. In act 604, an ion source generates an ion beam comprising ions of a first charge state and trace metal ions. For example, the ions of the first change state may comprise $_{75}As$ 3+ ions, whereby the trace metal ions comprise 50Ti 2+. It is to be noted that the present disclosure appreciates various other ions of the first charge state may be generated with various other trace metal ions, and all such combinations further fall within the scope of the disclosure. For example, the ions of the first change state may comprise $_{75}$As 4+ ions, whereby the trace metal ions comprise 56Fe 3+ ions.

The ion beam, for example, can be of various beam species (e.g., arsenic). In act 606, the ion beam can be accelerated and mass analyzed, in no specific order. In act 608, ions of the first charge state, along with the trace metal ions in the ion beam, can be selected simultaneously into an accelerator. In act 610, the first charge state ions may be further accelerated to a final energy and stripped of electrons by passing the ion beam through a charge stripper to convert the first charge state ions to a second charge state (e.g., As 4+). In act 612, the ions of the second charge state can be selected from the ion beam, whereby substantially all of the trace metal ions are removed from the ion beam prior to implantation of the second charge state ions into a workpiece.

It is to be appreciated that the example contamination case (e.g., Fe contamination in an As ion beam) discussed herein is just one example, and that the present disclosure further contemplates mitigation of all other metal contamination with a similar principal.

In general, the desired ion extracted from ion source can be designated as $_mX^a$, and the contaminant ion embedded inside the extracted ion beam is $_nY^b$, where "m" is the atomic mass of ion X, "a" is the charge state of ion X, "n" is the atomic mass of contaminant ion Y, and "b" is charge state of ion Y. The principal is applicable when the desired ion has energy "a*E" and the contaminant ion has energy "b*E", and when the atomic mass ratio of "m/n" equals to charge ratio "a/b", whereby the contaminant ion Y cannot be separated (e.g., distinguished) by a magnetic filter, electrostatic filter, and a velocity filter.

When a dopant gas material is introduced into an arc chamber of an ion source to produce ions, a plurality of charge states of the dopant species are generated during the formation of the plasma, along with possible trace metal ions. For example, when a dopant gas material comprising $AsH_3$ is fed into the arc chamber of the ion source for plasma ignition to obtain As ions, many different charge states of $_{75}$As ions (e.g., As+, As 2+, As 3+, As 4+, etc.) and one or more trace metal ions, such as $_{50}$Ti 2+, $_{56}$Fe 3+ and others, are generated in the ion source. The arc chamber of the ion source, for example, can comprise various metal components constructed from metals such as tungsten (W), molybdenum (Mo), and other metals. The arc chamber may also comprise other components that may contain trace metals such as titanium (Ti), iron (Fe) and/or other metals.

In general, an extraction voltage V is applied to an extraction electrode in order to extract ions from the arc chamber of the ion source in order to form an ion beam and to direct the ion beam into a mass analyzer. In some circumstances, however, ions of differing species can be selected to be output from the mass analyzer due to their mass-to-charge ratios being substantially similar or identical. For example, when the mass analyzer is configured to select $_{75}$As 3+ ions from the ion beam, an ion such as $_{50}$Ti 2+ having the same mass-to-charge ratio as $_{75}$As 3+ can likewise be selected by the mass analyzer (e.g., 50/2 for Ti equates to a mass-to-charge ratio of 25, which is the same as 75/3 for As). Therefore, in this example, both $_{50}$Ti 2+ and $_{75}$As 3+ ions will pass through the mass analyzer to enter downstream beamline components for further acceleration. One should note that before such further acceleration, the energy ratio of the example $_{75}$As 3+ ion to the $_{50}$Ti 2+ ion (e.g., $E_{As}/E_{Ti}$) is 3:2 due to the applied extraction voltage and the respective charge states of the ions. Also, velocities of the $_{75}$As 3+ ion ($v_{As}$) and $_{50}$Ti 2+ ion ($v_{Ti}$) are also substantially similar or identical, due to their mass ratio also being 3:2, as can be derived by using the kinetic energy formula of $E=(½) mv^2$.

When an ion beam comprising ions of a first charge state (e.g., $_{75}$As 3+ ions) and trace metal ions (e.g., $_{50}$Ti 2+ trace metal ions) are further accelerated by a downstream RF linear accelerator (LINAC), for example, both ions will synchronize with the RF phase change at the acceleration electrodes due to the respective entering velocities to the RF LINAC being substantially the same. Therefore, the respective ions will exit the RF LINAC with substantially the same final velocity and energy ratio (e.g., 3:2). While providing acceleration, the RF LINAC can also serve as a velocity filter; however, the RF LINAC cannot differentiate between $_{75}$As 3+ ions and $_{50}$Ti 2+ ions due to their identical velocities.

In a circumstance where the ion beam is accelerated by a DC-based accelerator rather than the RF LINAC discussed above, the energy gain of the ions is based on their respective charge states and the voltage provided for acceleration. Therefore, in a similar manner, the final energy ratio of the $_{75}$As 3+ ions to the $_{50}$Ti 2+ ions will still be the same (e.g., 3:2), as well.

A downstream electromagnet, for example, even after final acceleration by either an RF- or DC-based accelerator, cannot separate the ions due to similar reasons as mentioned above. On the other hand, an electrostatic energy filter can be used in an ion implantation system to separate ions with different energy-to-charge ratio selection. However, in this case, an electrostatic energy filter cannot separate them either; since after final acceleration, the energy ratio of $_{75}$As 3+ ion to $_{50}$Ti 2+ is 3:2 and their charge ratio is also 3:2.

A filtration solution for such particular trace metal contamination mechanism from the ion source is thus needed when high charge state ions are desired to obtain high energy for implantation to a workpiece, without adding substantial beamline length for acceleration low charge state ions.

The present disclosure thus describes an example apparatus comprising a charge stripper and a charge state selector, whereby the charge state selector is an electromagnetic mass analyzer located at a position downstream, and next to, the charge stripper. This combined apparatus, for example, provides an immediate removal of trace metal ions, such as $_{50}$Ti 2+ from the ion beam mentioned above, when the charge state selector is set to select $_{75}$As 4+ ions (e.g., second charge state), rather than $_{75}$As 3+ ions (e.g., first charge state) from the ion beam after $_{75}$As 3+ ions go through the charge stripping process. The mass-to-charge ratio of $_{75}$As 4+ ions is 75/4 (i.e., 18.75) and the mass to charge ratio of $_{50}$Ti 2+ ions is still 50/2 (i.e., 25), which thus provides for removal of the trace metal ions, even though they are at similar velocities.

Therefore, when the charge state selector positioned after the charge stripper is set to select $_{75}$As 4+ ions rather than $_{75}$As 3+ ions, for example, the trace metal $_{50}$Ti 2+ ions cannot be selected, and is therefore removed from the ion beam. Indeed, there will be no other Ti charge state ions that can be selected after charge stripping to pass the charge state selector magnet with $_{75}$As 4+. Thus, the selected $_{75}$As 4+ ions can be further accelerated by an additional RF- or DC-based accelerator in order to reach a desired higher energy for implantation without the trace metal $_{50}$Ti 2+ contamination in the ion beam, thereby providing the desired implantation to the workpiece.

In another embodiment, the charge state selector can comprise an electrostatic filter, whereby the electrostatic filter selects the desired second charge state ions after the charge stripping process based on the energy-to-charge ratio. For example, as mentioned above, the energy ratio of first charge state ions of $_{75}$As 3+ to trace metal ions of $_{50}$Ti 2+ is 3:2, and their charge ratio is also 3:2. Therefore, the electrostatic filter cannot separate the ions due to their identical energy-to-charge ratios (i.e., 1). After the charge stripping process, the electrostatic filter can be configured to select second charge state ions of $_{75}$As 4+ with its energy-to-charge ratio at 3:4, and the trace metal ions of $_{50}$Ti 2+ will be filtered out due to its different energy-to-charge ratio at 2:2. Again, there will be no other potential $_{50}$Ti charge state ions that can be selected after charge stripping in order to pass the electrostatic filter along with the $_{75}$As 4+. The selected $_{75}$As 4+ ions can be further accelerated by additional RF- or DC-based accelerator in order to reach a desired higher energy for implantation without the trace metal $_{50}$Ti 2+ contamination in the ion beam, thereby providing the desired implantation to the workpiece.

The present disclosure appreciates that similar mechanisms of trace metal contamination described and mentioned above can also happen when the mass analyzing magnet is configured to select $_{75}$As 4+ ions from the ion source, where $_{56}$Fe 3+ trace metal ions from the ion source become the contaminant and can pass the mass analyzer together with $_{75}$As 4+ ions. Similarly, a filtration solution combining a charge stripper and a downstream charge state selector discussed above can be utilized, as well.

Figure 7:
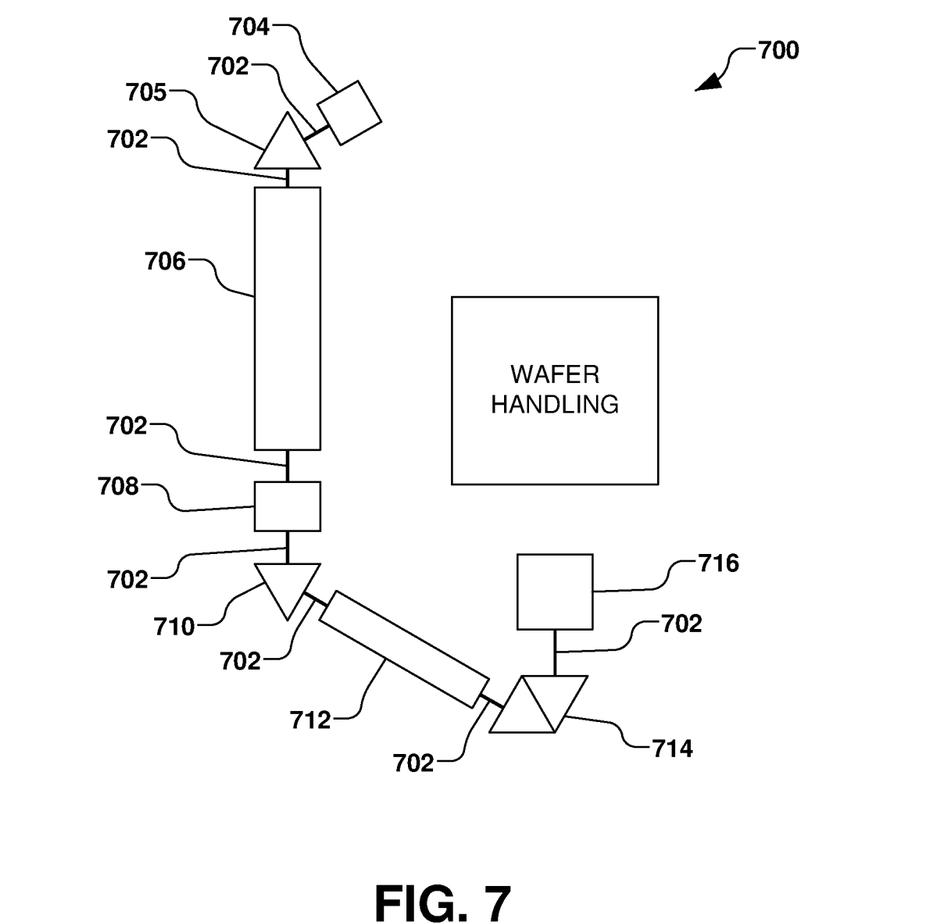
FIG. 7 is an example layout of an ion implantation system in accordance with a yet further example of the present disclosure.

The present disclosure further provides for selecting a combination of charge states with specific dopants and/or acceleration levels. FIG. 7 further illustrates a simplified system 700 in accordance with yet another example of the present disclosure. For example, an ion beam 702 is formed at an ion source 704, whereby the ion beam is extracted from the ion source, mass analyzed by a mass analyzer 705, and passed through a first accelerator 706 (e.g., a linear accelerator or LINAC) and a charge stripper 708. As described above, ion beam 702 at the exit of the first accelerator 706 can comprise first charge state ions (e.g., $_{75}$As 3+) and trace metal ions (e.g., $_{56}$Ti 2+) from the ion source 704. The charge stripper 708 in the present example is positioned between the first accelerator 706 and a first magnet 710 configured to convert the first charge state ions to other charge state ions, including the desired second charge state ions (e.g., $_{75}$As 4+). A second accelerator 712 (e.g., a so-called energy booster or E-booster) may be further provided between the first magnet 710 and a second magnet 714 to accelerate the second charge state ions selected by first magnet 710 to a higher energy. After passing through the second magnet 714, the ion beam 702 is directed to an end station 716 for implantation to the workpiece. The first magnet 710, for example, may be utilized as a charge state selector.

For example, the first magnet 710 may comprise a first 60-degree magnet that is provided between the first accelerator 706 and the E-booster 712, and the second magnet 714 may comprise a 120-degree magnet that is provided after the E booster for energy filtering. It should be noted that while specific angles for the first magnet 710 and second magnet 714 are described herein, various alternatives also exist, and are also contemplated as falling within the scope of the present disclosure.

One advantageous aspect of the above example is that the first magnet 710 positioned downstream of the charge stripper 708, generally removes all other charge states and the trace metal ions by setting the first magnet 710 to select the desired second charge state ions after stripping process from first charge state ion undergone at the charge stripper 708.

Figure 8:
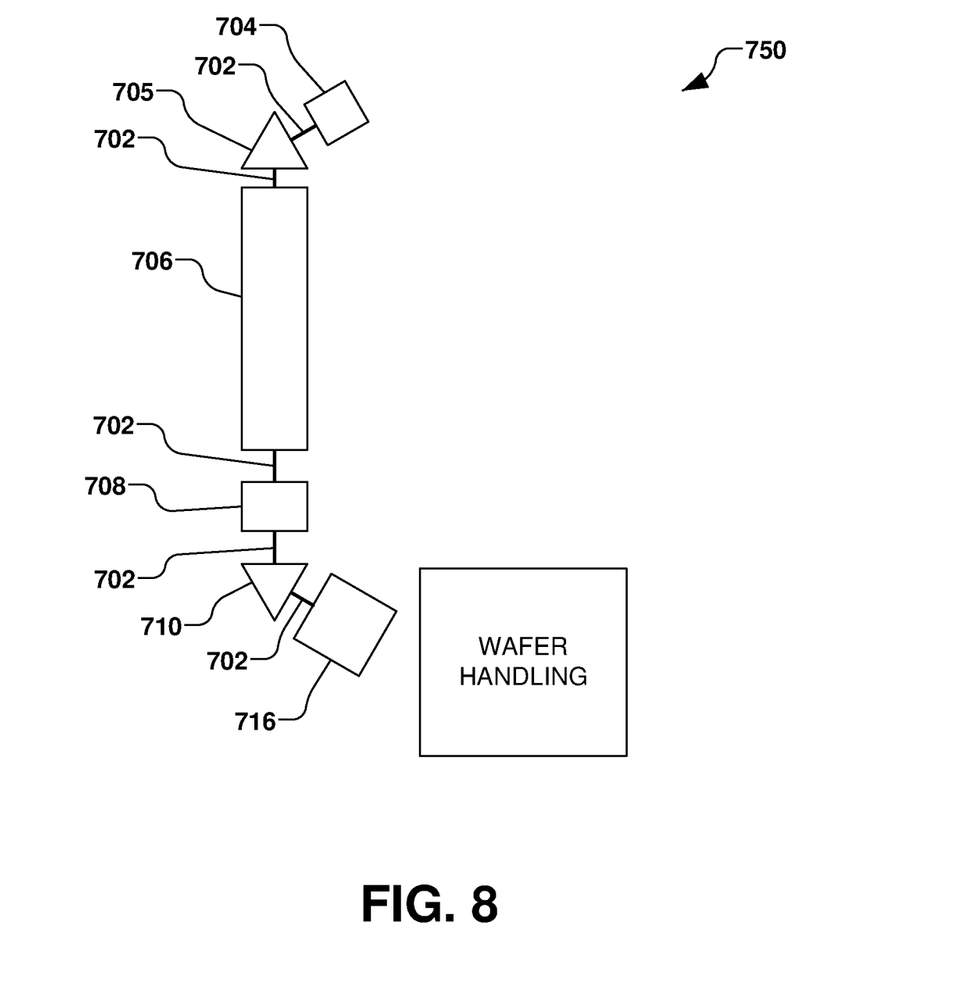
FIG. 8 is a simplified schematic layout of an implant system in accordance with a further example of the present disclosure.

In an alternative embodiment, as illustrated in FIG. 8, the second accelerator 712 and second magnet 714 illustrated in FIG. 7 can be omitted. After charge stripping at the charge stripper 708 of FIG. 8, for example, the second charge state ion beam 702 at the second charge state selected by first magnet 710 without trace metal ion contamination may be implanted to the workpiece in the end station 716 without further acceleration.

Although the disclosure has been shown and described with respect to a certain applications and implementations, it will be appreciated that equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (i.e., that is functionally equivalent), even though not structurally equivalent to the disclosed structure, which performs the function in the herein illustrated exemplary implementations of the disclosure.

In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "including", "has", "having", and variants thereof are used in either the detailed description or the claims, these terms are intended to be inclusive in a manner similar to the term "comprising".

What is claimed is:

1. An ion implantation system, comprising:
    an ion source configured to generate desired ions of a desired species and trace metal ions of a contaminant species, wherein the desired ions of the desired species are at a first charge state, and wherein a charge-to-mass ratio of the desired ions and the trace metal ions is equal, wherein the desired ions comprise $_{75}$As 3+ ions and the trace metal ions comprise $_{50}$Ti2+ ions;
    an extraction apparatus configured to extract the desired ions and the trace metal ions from the ion source to define a first ion beam;
    a mass analyzer configured to select the desired ions and the trace metal ions from the first ion beam, thereby defining a mass analyzed ion beam;
    an accelerator configured to accelerate the mass analyzed ion beam from a first energy to a second energy;
    a charge stripping apparatus configured to strip at least one electron from the desired ions, thereby defining a second ion beam comprising the desired ions at a second charge state and the trace metal ions; and
    a charge selector positioned downstream of the charge stripping apparatus, wherein the charge selector is configured to selectively pass only the desired ions at the second charge state therethrough, thereby defining a final ion beam comprising the desired ions at the second charge state and approximately zero trace metal ions.

2. The ion implantation system of claim 1, wherein the charge selector comprises an electromagnetic mass analyzer positioned proximate to the charge stripping apparatus.

3. The ion implantation system of claim 1, wherein the charge stripping apparatus is positioned within the accelerator.

4. The ion implantation system of claim 1, wherein the accelerator comprises a plurality of accelerator stages, and wherein the charge stripping apparatus is positioned between at least two of the plurality of accelerator stages.

5. The ion implantation system of claim 4, wherein the accelerator comprises an RF accelerator, and wherein the plurality of accelerator stages respectively comprise one or more resonators configured to generate an accelerating field.

6. The ion implantation system of claim 1, wherein the accelerator comprises DC accelerator configured to accelerate the desired ions via a stationary DC high voltage.

7. The ion implantation system of claim 1, wherein the accelerator comprises an RF accelerator, and comprising one or more resonators configured to generating an accelerating RF field.

8. The ion implantation system of claim 1, wherein the charge selector comprises an energy filter.

9. The ion implantation system of claim 1, further comprising a scanner configured to reciprocally scan the final ion beam to define a scanned ion beam.

10. The ion implantation system of claim 9, wherein the scanner comprises an electrostatic scanner or an electromagnetic scanner configured to respectively electrostatically or electromagnetically scan the final ion beam to define the scanned ion beam.

11. The ion implantation system of claim 9, further comprising an angle corrector lens configured to parallelize and shift the scanned ion beam.

12. The ion implantation system of claim 1, wherein the charge stripping apparatus comprises a pump and a gas source, wherein the pump is configured to pump a gas from the gas source and to control a flow of the gas into the accelerator, and wherein the flow of the gas is configured to strip electrons from the desired ions of the desired species.

13. The ion implantation system of claim 12, wherein the gas comprises sulfur hexafluoride.

14. An ion implantation system, comprising:
an ion source comprising arc chamber, the arc chamber having a trace amount of a contaminant species contained therein, wherein the contaminant species comprises titanium, and wherein the ion source is configured to generate arsenic ions at a first charge state of 3+ and trace metal ions of the contaminant species within the arc chamber, wherein a charge-to-mass ratio of the arsenic ions and the trace metal ions is equal;
an extraction apparatus configured to extract the arsenic ions and the trace metal ions from the ion source to define a first ion beam;
a mass analyzer configured to select the arsenic ions and the trace metal ions from the first ion beam, thereby defining a mass analyzed ion beam;
an accelerator configured to accelerate the mass analyzed ion beam from a first energy to a second energy;
a charge stripper configured to strip at least one electron from the arsenic ions, thereby defining a second ion beam comprising the arsenic ions at a second charge state and the trace metal ions; and
a charge selector positioned downstream of the charge stripping apparatus, wherein the charge selector is configured to selectively pass only the arsenic ions at the second charge state therethrough, thereby defining a final ion beam comprising the arsenic ions at the second charge state and approximately zero trace metal ions.

15. The ion implantation system of claim 14, wherein the accelerator comprises a plurality of accelerator stages, wherein the charge stripper is positioned downstream of at least one of the plurality of accelerator stages.

16. The ion implantation system of claim 15, further comprising an energy filter positioned downstream of the accelerator, wherein the charge selector is positioned between at least two of the plurality of acceleration stages, and wherein the energy filter is further configured to filter the final ion beam.

17. The ion implantation system of claim 14, wherein the trace metal ions comprise $_{50}$Ti 2+ ions when the arsenic ions at the first charge state comprise $_{75}$As 3+ ions, and wherein the trace metal ions comprise $_{56}$Fe 3+ ions when the arsenic ions at the first charge state comprise $_{75}$As 4+ ions.

18. The ion implantation system of claim 14, wherein the final ion beam comprises zero trace metal ions.

* * * * *